(12) United States Patent
Chen et al.

(10) Patent No.: US 9,826,627 B2
(45) Date of Patent: Nov. 21, 2017

(54) FLEXIBLE CIRCUIT BOARD AND DISPLAY APPARATUS

(71) Applicants: BOE Technology Group Co., Ltd., Beijing (CN); HEFEI Xinsheng Optoelectronics Technology Co., Ltd., Hefei (CN)

(72) Inventors: Zhiyuan Chen, Beijing (CN); Zhengyuan Zhang, Beijing (CN); Chao Lv, Beijing (CN); Baoyong Nie, Beijing (CN)

(73) Assignees: BOE Technology Group Co., Ltd., Beijing (CN); Hefei Xinsheng Optoelectronics Technology Co., Ltd., Hefei (CN)

( * ) Notice: Subject to any disclaimer, the term of this patent is extended or adjusted under 35 U.S.C. 154(b) by 0 days.

(21) Appl. No.: 15/238,371

(22) Filed: Aug. 16, 2016

(65) Prior Publication Data

US 2017/0196076 A1 Jul. 6, 2017

(30) Foreign Application Priority Data

Jan. 4, 2016 (CN) .......................... 2016 1 0005933

(51) Int. Cl.
| H05K 1/00 | (2006.01) |
| G02F 1/1345 | (2006.01) |
| H05K 1/02 | (2006.01) |
| G09G 3/00 | (2006.01) |

(52) U.S. Cl.
CPC .............. *H05K 1/028* (2013.01); *G09G 3/00* (2013.01); *G09G 2300/04* (2013.01); *G09G 2380/02* (2013.01); *H05K 2201/05* (2013.01); *H05K 2201/09054* (2013.01)

(58) Field of Classification Search
CPC .............. H05K 1/028; H05K 2201/05; H05K 2201/09054; G09G 3/00; G09G 2380/02; G09G 2300/04
USPC .......................... 174/254; 361/749; 349/150
See application file for complete search history.

(56) References Cited

U.S. PATENT DOCUMENTS

| 6,686,987 B1 * | 2/2004 | Sakaki .................. G02F 1/1345 349/149 |
| 2008/0013029 A1 * | 1/2008 | Kim ...................... G02F 1/1345 349/150 |
| 2008/0165301 A1 * | 7/2008 | Chang ................. G02F 1/13452 349/40 |
| 2009/0218116 A1 * | 9/2009 | Wu ...................... H01L 23/4985 174/254 |

* cited by examiner

*Primary Examiner* — Sherman Ng
(74) *Attorney, Agent, or Firm* — Banner & Witcoff, Ltd.

(57) ABSTRACT

A flexible circuit board and a display apparatus are provided. The flexible circuit board comprises a substrate and a driver integrated circuit provided on the substrate. The flexible circuit board further comprises a support pad, the support pad is provided on at least one side of the driver integrated circuit in a first direction, and a height of the support pad is greater than a height of the driver integrated circuit. A distance between the support pad and the driver integrated circuit in the second direction is smaller than or equal to a width of the driver integrated circuit in a second direction. Directions in which two adjacent side edges of the driver integrated circuit are provided are respectively the first direction and the second direction.

15 Claims, 7 Drawing Sheets

FLEXIBLE CIRCUIT BOARD AND DISPLAY APPARATUS

This application claims priority to and the benefit of Chinese Patent Application No. 201610005933.9 filed on Jan. 4, 2016, which application is incorporated herein in its entirety.

TECHNICAL FIELD

Embodiments of the present disclosure relate to a flexible circuit board and a display apparatus.

BACKGROUND

In display field, in order to reduce a width of a screen frame of a display apparatus, a bendable flexible circuit board is adopted at the position of the screen frame to implement signal transmission. For example, a driver integrated circuit (Driver IC) is provided on the flexible circuit board by a Chip On Film (COF) technology, and an input end lead and an output end lead are provided on the flexible circuit board and are respectively connected with a Printed Circuit Board (PCB) and a display panel of the display apparatus. Therefore, the PCB provides a control signal to the display panel via the flexible circuit board so as to drive the display panel to carry out display.

SUMMARY

According to embodiments of the disclosure, a flexible circuit board is provided. The flexible circuit board comprises a substrate and a driver integrated circuit provided on the substrate. The flexible circuit board further comprises a support pad, the support pad is provided on at least one side of the driver integrated circuit in a first direction, and a height of the support pad is greater than a height of the driver integrated circuit. A distance between the support pad and the driver integrated circuit in the second direction is smaller than or equal to a width of the driver integrated circuit in a second direction. Directions in which two adjacent side edges of the driver integrated circuit are provided are respectively the first direction and the second direction.

For example, the support pad is further provided on at least one side of the driver integrated circuit in the second direction, and a distance between the support pad provided in the second direction and the driver integrated circuit in the first direction is smaller than or equal to a width of the driver integrated circuit in the first direction.

For example, the support pads are respectively provided on two adjacent sides of the driver integrated circuit and are of an integral structure.

For example, the support pads are provided around the driver integrated circuit and are of an integral structure.

For example, the support pad and the substrate are of an integral structure.

For example, the support pad and the driver integrated circuit are of an integral structure.

For example, the support pad is of a strip shape.

For example, a range of a difference between the height of the support pad and the height of the driver integrated circuit is 0.1 mm to 1 mm.

For example, a width of the support pad, which is provided in the first direction, along the second direction is 0.1 mm to 5 mm.

For example, a length of the support pad, which is provided in the first direction, along the first direction, is greater than or equal to a length of the side edge of the driver integrated circuit corresponding to the support pad.

For example, a width of the support pad, which is provided in the second direction, along the first direction is 0.1 mm to 5 mm.

For example, a length of the support pad, which is provided in the second direction, along the second direction is greater than or equal to a length of the side edge of the driver integrated circuit corresponding to the support pad.

For example, the support pad is made of an elastic insulating material.

For example, the support pad provided in the first direction has a plurality of subsections disconnected from each other.

For example, the support pad provided in the second direction has a plurality of subsections disconnected from each other.

According to embodiments of the disclosure, a display apparatus is provided. The display apparatus comprises the flexible circuit board as described above.

BRIEF DESCRIPTION OF THE DRAWINGS

In order to clearly illustrate the technical solution of the embodiments of the disclosure or the prior art, the drawings of the embodiments or description in the prior art will be briefly described in the following. It is obvious that the described drawings are only related to some embodiments of the disclosure, and those skilled in the art also can obtain other drawings, without any inventive work, according to the drawings.

DETAILED DESCRIPTION

The technical solution of the embodiments will be described in a clearly and fully understandable way in connection with the drawings related to the embodiments of the disclosure. It is obvious that the described embodiments are just a part but not all of the embodiments of the disclosure. Based on the embodiments of the disclosure, those skilled in the art can obtain other embodiment(s), without any inventive work, which should be within the scope of protection of the disclosure.

Figure 1A:
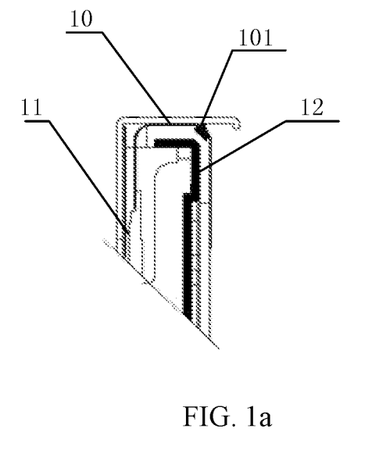
FIG. 1a to FIG. 1c are schematic views illustrating relative positions of a flexible circuit board and a back plate of backlight.
Figure 1B:
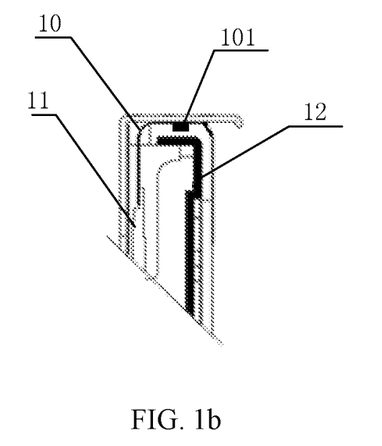
Figure 1C:
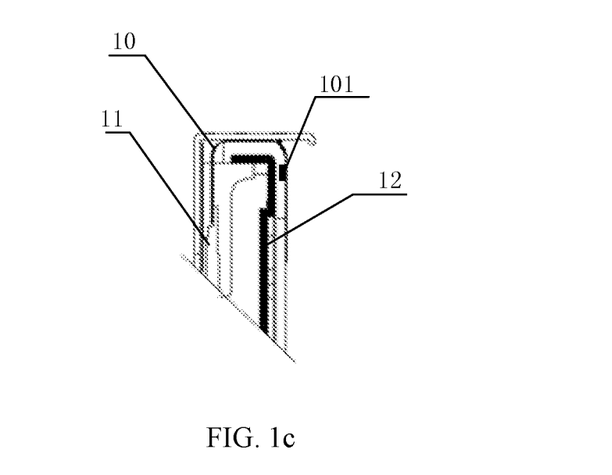
Figure 1D:
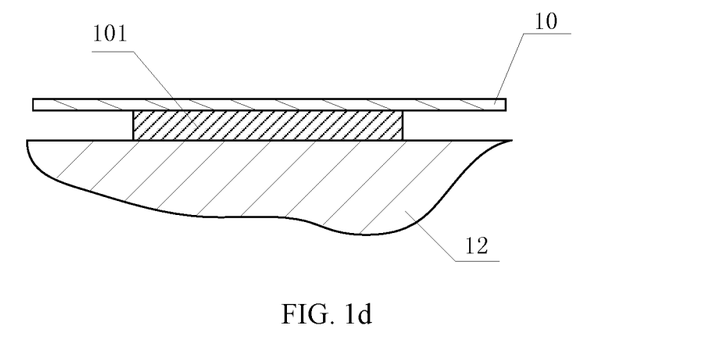
FIG. 1d is a schematic view illustrating collision between a driver integrated circuit (Driver IC) on the flexible circuit board and the back plate of backlight.

In a display apparatus, as shown in FIG. 1a to FIG. 1c, a flexible circuit board 10 is bent so as to arrange a Printed Circuit Board (PCB) 11 at a back side of a display panel. In addition, a back plate 12 of backlight is also provided at the back side of the display panel, and a Driver IC (Driver Integrated Circuit) 101 provided on a substrate of the flexible circuit board 10 is provided to be opposite to the back plate 12 of the backlight. In this way, in the assembling process of the display apparatus or in the case that the whole display apparatus is shaken, the flexible circuit board 10 is deformed due to its flexibility characteristic to cause collision between the driver IC 101 on the substrate of the flexible circuit board 10 and the back plate 12 of the backlight, as shown in FIG. 1d, thereby causing damage to the driver IC 101.

For example, as shown in FIG. 1a, the driver IC 101 is opposite to a corner of the back plate 12 of backlight; as shown in FIG. 1b, the driver IC 101 is opposite to a side surface of the back plate 12 of backlight; and as shown in FIG. 1c, the driver IC 101 is opposite to a front surface of the back plate 12 of backlight. The driver IC 101 shown in FIG. 1a, FIG. 1b and FIG. 1c will be collided with the back plate 12 of backlight along with deformation of the flexible circuit board 10 and be damaged. The damaged driver IC 101 causes breakage of the flexible circuit board 10, thereby reducing the product quality.

Figure 2:
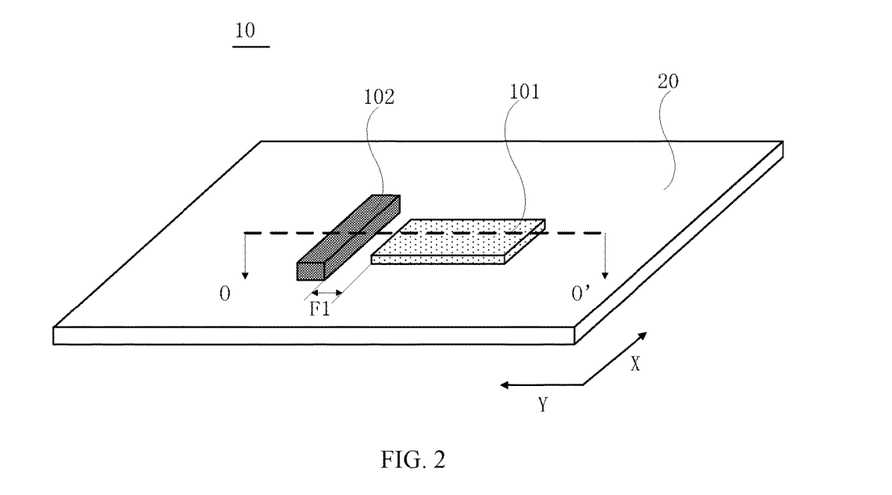
FIG. 2 is a structural schematic view illustrating a flexible circuit board according to embodiments of the present disclosure.
Figure 3:
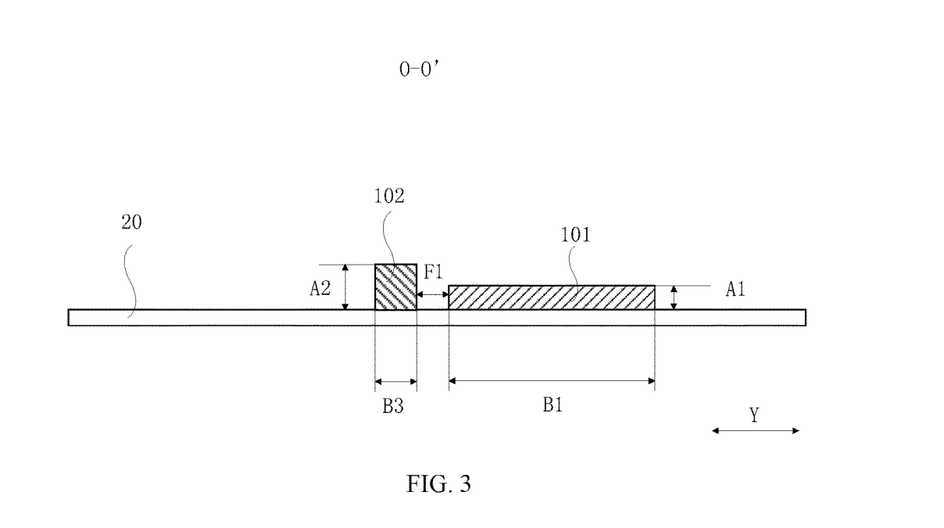
FIG. 3 is a sectional view taken along a direction of O-O' of FIG. 2.

Embodiments of the present disclosure provide a flexible circuit board 10, as shown in FIG. 2, including a substrate 20 and a driver IC 101 provided on the substrate. The flexible circuit board 10 further includes a support pad 102. The support pad 102 is provided on at least one side of the driver IC 101 in a first direction X. As shown in FIG. 3 (which is a sectional view taken along a direction of O-O' of FIG. 2), a height A2 of the support pad 102 is greater than a height A1 of the driver IC 101.

For example, a distance F1 between the support pad 102 and the driver IC in a second direction is smaller than or equal to a width B1 of the driver IC 101 in the second direction Y. In this way, the support pad 102 is provided near the driver IC 101. In the case that the flexible circuit board 101 is deformed, a portion of the substrate 20 at a position corresponding to the driver IC 101 and a portion of the substrate 20 at a position corresponding to the support pad 102 near the driver IC 101 are consistent in deformation trend; and thus, the support pad 10 provided near the driver IC 101 gets close to the back plate 12 of backlight in the case that the driver IC 101 gets close to the back plate 12 of backlight in the deforming process of the flexible circuit board 101.

It should be noted that, directions in which two adjacent side edges of the driver IC 101 are provided are respectively the first direction X and the second direction Y; and more particularly, a direction in which one of the two adjacent side edges of the driver IC 101 is provided is the first direction X, and a direction in which the other of the two adjacent side edges of the driver IC 101 is provided is the second direction Y. In other words, the first direction X is the same or approximately the same as the direction in which one of the two adjacent side edges of the driver IC 101 is provided, and the second direction Y is the same or approximately the same as the direction in which the other of the two adjacent side edges of the driver IC 101 is provided.

In the case that the first direction X is the same as the direction in which one of the two adjacent side edges of the driver IC 101 is provided and the second direction Y is the same as the direction in which the other of the two adjacent side edges of the driver IC 101 is provided, the first direction X for example is perpendicular to the second direction Y because the driver IC 101 is generally of a rectangular shape.

In addition, the first direction X and the second direction Y are defined according to an orientation of the flexible circuit board 10 in the drawings; it should be understood that these terms indicating directions are relative concepts and are used for description and clarification, and can be correspondingly changed along with the change of the orientation of the flexible circuit board 10.

Figure 4:
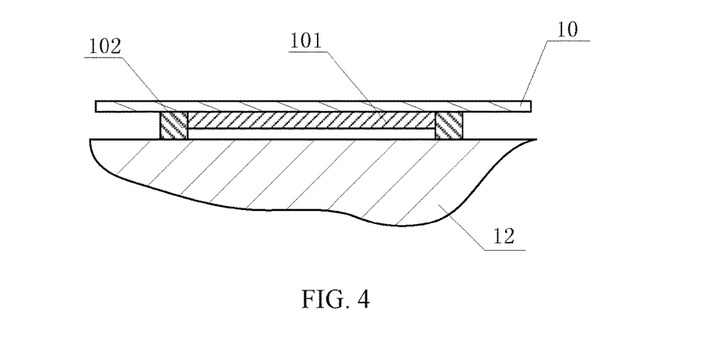
FIG. 4 is a schematic view illustrating that a support pad of the flexible circuit board according to the embodiments of the present disclosure is in contact with a back plate of backlight.

It should be noted that, as shown in FIG. 4, the smaller the value of the distance F1 is, the closer the support pad 102 is to the driver IC 101, and the more timely the support pad 102 gets in contact with the back plate 12 of backlight in the process that the flexible circuit board 10 is deformed and the driver IC 101 gets close to the back plate of backlight 12, thereby better protecting the driver IC 101 from being collided with the back plate 12 of backlight. For example, in a case of not considering a manufacturing tolerance, the support pad 102 is provided to be next to the driver IC 101, i.e., the value of the distance F1 is zero.

It should be noted that a range of a difference between the height A2 of the support pad 102 and the height A1 of the driver IC 101 is between 0.1 mm and 1 mm. In the case that the height different is smaller than 0.1 mm, the different between the height A2 of the support pad 102 and the height A1 of the driver IC 101 is too small, so that the requirements on manufacturing precision are relatively high. In the case that the height difference is greater than 1 mm, the requirements on the manufacturing precision are reduced, but an occupation space of the support pad 102 is increased due to a great value of the height A2 of the support pad 102, which is not beneficial to a compact design of the display apparatus.

The embodiments of the present disclosure provide the flexible circuit board which includes the substrate and the driver IC provided on the substrate. The flexible circuit board further includes the support pad. The support pad is provided on at least one side of the driver IC in the first direction. The height of the support pad is greater than the height of the driver IC. Moreover, the distance between the support pad and the driver IC in the second direction is smaller than or equal to the width of the driver IC in the second direction, and directions in which two adjacent side edges of the driver IC are provided are respectively the first direction and the second direction.

The distance between the support pad and the driver IC in the second direction is smaller than or equal to the width of the driver IC in the second direction; and thus, in the case that the flexible circuit board is deformed and the driver IC gets close to the back plate of backlight, the support pad gets close to the back plate of backlight as well. Because the height of the support pad is greater than the height of the driver IC, the support pad gets in contact with the back plate of backlight ahead of the driver IC. In this way, under supporting action of the support pad, the driver IC is prevented from getting further close to the back plate of backlight along with deformation of the flexible circuit board, and thus a probability of generating damages caused by the collision between the driver IC and the back plate of backlight is reduced and the product quality is improved.

Figure 5A:
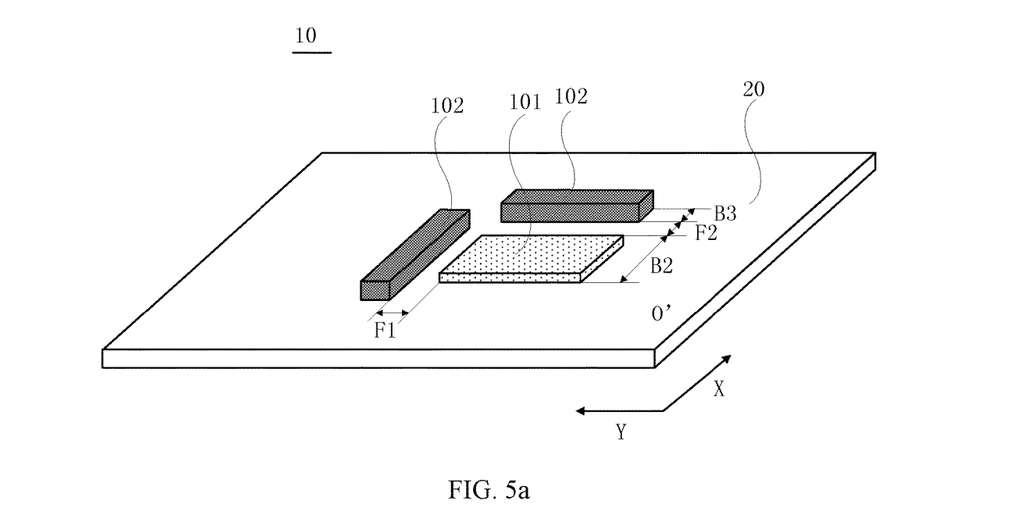
FIG. 5a is a schematic view illustrating the support pads of the flexible circuit board according to the embodiments of the present disclosure.

As shown in FIG. 5a, the support pad 102 is further provided on at least one side of the driver IC 101 in the second direction Y. For example, the distance F2 between the support pad 102, which is provided on at least one side of the driver IC 101 in the second direction Y, and the driver IC 101 in the first direction is smaller than or equal to a width B2 of the driver IC 101 in the first direction X. In this way, the support pad 102 provided on at least one side of the driver IC 101 in the second direction Y is provided near the driver IC 101. In the case that the flexible circuit board 101 is deformed, the portion of the substrate 20 at the position corresponding to the driver IC 101 and a portion of the substrate 20 at a position corresponding to the support pad 102, which is provided on at least one side of the driver IC 101 in the second direction Y and is provided near the driver IC 101, are consistent in deformation trend, so that this support pad 102 gets close to the back plate 12 of backlight in the case that the driver IC 101 gets close to the back plate of backlight 12 during the deforming process.

As shown in FIG. 5, a corner of the driver IC 101, which is easy to be collided, is protected by providing the support pads 102 on two adjacent sides of the driver IC 101 in the first direction X and the second direction Y.

In addition, the driver IC 101 is generally of rectangular shape; in this case, the support pad 102 provided on the side of the driver IC 101 for example is of a strip shape, so that the side edge of the driver IC 101 near which the support pad 102 is provided is fully protected.

Figure 5B:
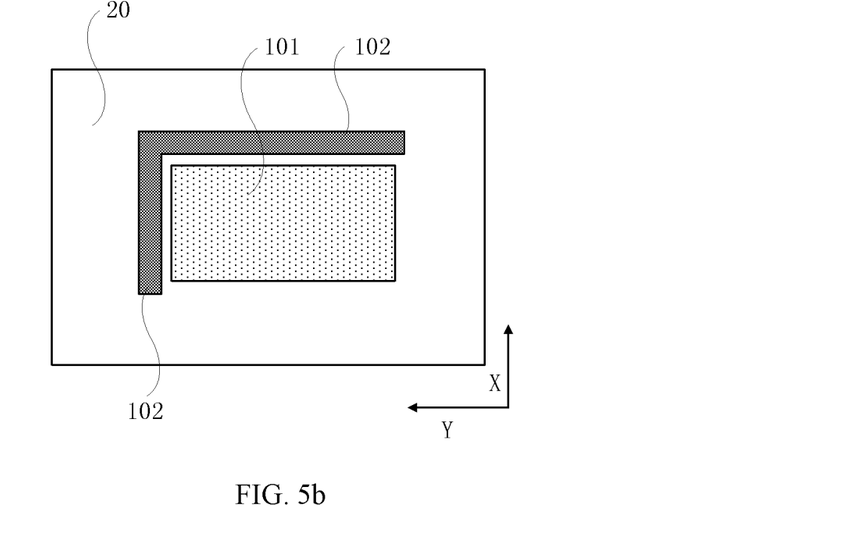
FIG. 5b is a schematic view illustrating that the support pads as shown in FIG. 5a is an integrated structure.

Furthermore, as shown in FIG. 5b, the support pads 102 provided on two adjacent sides (one side is in the first direction X and the other side is in the second direction Y) of the driver IC 101 for example is of an integral structure, so that the support pad 102 with a corner is prepared by a single forming process and is adhered to the substrate 20 by a single fixing process (e.g., an adhering process), and two side edges and one corner of the driver IC 101 are protected. In this way, the adhering process does not need to be repeatedly performed to fix the support pads 102 on two adjacent sides of the driver IC. Therefore, the production process is simplified and the production efficiency is improved.

Figure 6A:
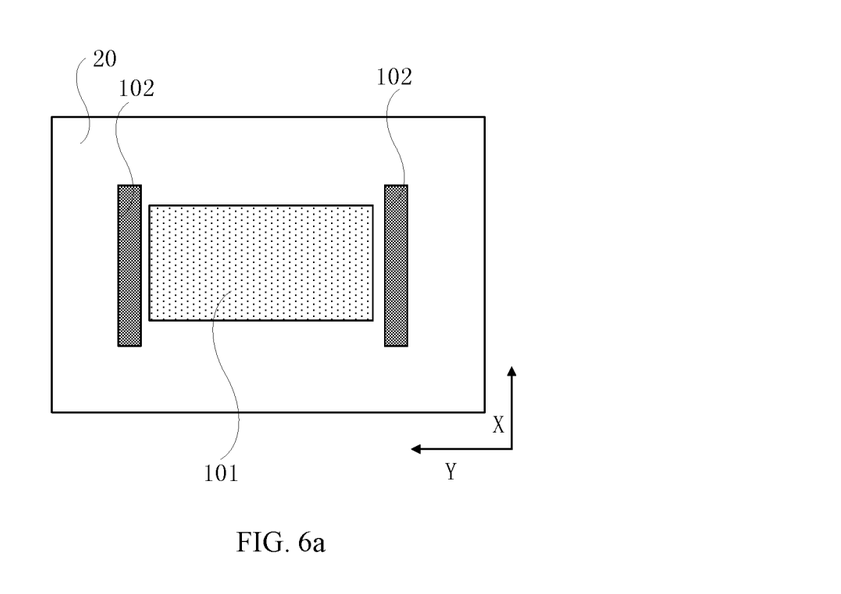
FIG. 6a is another schematic view illustrating the support pads of the flexible circuit board according to the embodiments of the present disclosure.
Figure 6B:
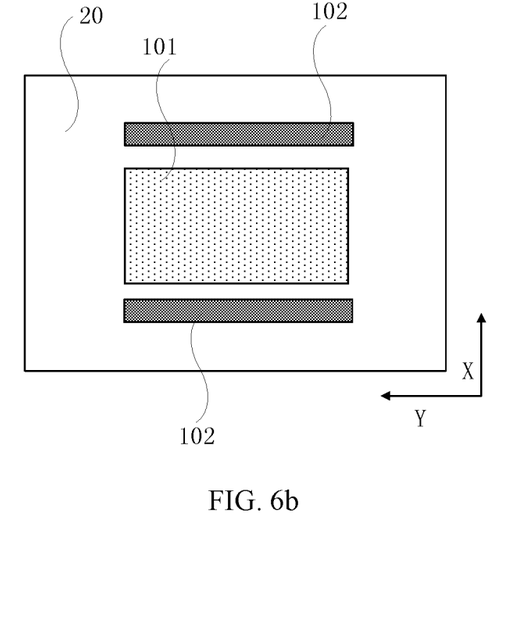
FIG. 6b is still another schematic view illustrating the support pads of the flexible circuit board according to the embodiments of the present disclosure.

Moreover, for some driver ICs 101, two side edges thereof in the same direction are both easy to collide with the back plate 12 of backlight in the case that the flexible circuit board 10 is deformed. In order to avoid such collision, for example, as shown in FIG. 6a, the support pads 102 are provided on both sides of the driver IC 101 in the first direction X; or, as shown in FIG. 6b, the support pads 102 are provided on both sides of the driver IC 101 in the second direction Y.

In this way, in the case that the flexible circuit board 10 is deformed and the driver IC 101 moves towards the back plate 12 of backlight, the support pads 102 provided on two opposite sides (upper and lower sides, or left and right sides) of the driver IC 101 gets in contact with the back plate 12 of backlight ahead of the driver IC 101, so that two opposite sides of the driver IC 101 are under balanced forces, and a case that the side of the driver IC 101, on which the support pad 102 is not provided, is possibly collided due to unbalanced forces is avoided.

It should be noted that direction words such as 'upper', 'lower', 'left', 'right' and the like are defined with respect to an orientation in which the substrate or the driver IC in the drawings is schematically placed, and it should be understood that these direction words are relative concepts, are used for description and clarification, and can be correspondingly changed along with the change of the orientation in which the substrate or the driver IC is placed.

Figure 7A:
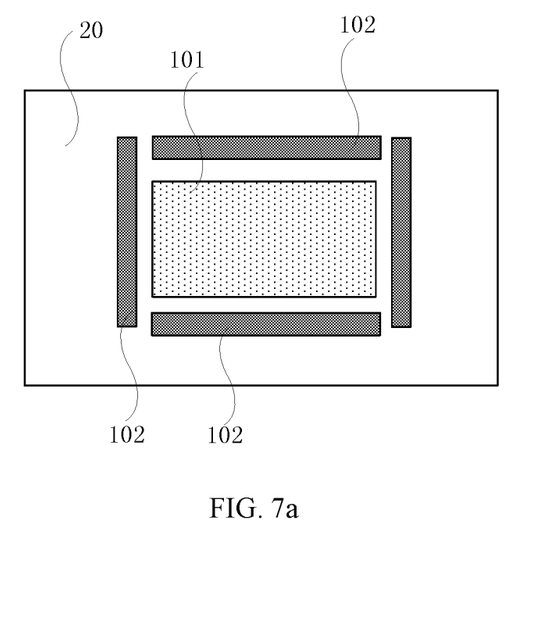
FIG. 7a is a structural schematic view illustrating that the support pads are provided around a driver IC of the flexible circuit board according to the embodiments of the present disclosure.

Furthermore, for some driver ICs 101, four side edges thereof are all easy to collide with the back plate 12 of backlight in the case that the flexible circuit board 10 is deformed. In order to avoid such collision, as shown in FIG. 7a, the support pads 102 for example are provided around the driver IC 101.

Therefore, forces applied on the periphery of the driver IC 101 are balanced, so that all four side edges of the driver IC 101 are protected by the support pads 102 provided around the driver IC 101, and a possibility that the driver IC 101 is collided in the case that the flexible circuit board 10 is deformed is further reduced.

Figure 7B:
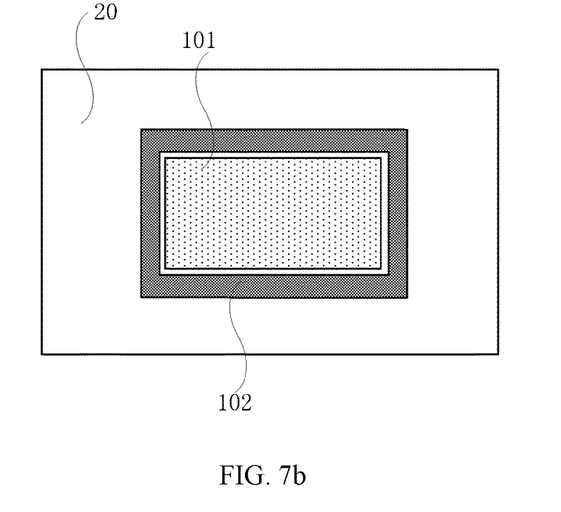
FIG. 7b is a schematic view illustrating that the support pads as shown in FIG. 7a is an integrated structure.

For example, as shown in FIG. 7b, the support pads 102 around the driver IC 101 is of an integral structure, so that a ring-shaped support pad 102 is prepared by adopting a single forming process and is adhered to the substrate 20 through a single fixing process (e.g., an adhering process), and the driver IC 101 is provided at a region surrounded the ring-shaped support pad 102. In this way, the adhering process does not need to be repeatedly adopted to fix the support pads 102 around the driver IC 101. Therefore, the production process is simplified and the production efficiency is improved.

Moreover, for example, a width B3 (in the second direction Y as shown in FIG. 3 or in the first direction X as shown in FIG. 5a) of the support pad 102 is 0.1 mm to 5 mm. In the case that the width B3 is smaller than 0.1 mm, the width B3 of the support pad 102 is too small, so that the requirements on manufacturing precision are relatively high. In the case that the width B3 is greater than 5 mm, the requirements on manufacturing precision are reduced, but an occupation space of the support pad 102 is increased due to a great value of the width B3 of the support pad 102, which is not beneficial to a compact design of the display apparatus.

Moreover, for example, a length (in the first direction X as shown in FIG. 2 and in the second direction Y as shown in FIG. 5a) of the support pad 102 is greater than or equal to or smaller than a length of the side edge of the driver IC 101 corresponding to the support pad 102. Furthermore, in order to improve a protection effect of the support pad 102 on the driver IC 101, the length (in the first direction X as shown in FIG. 2 and in the second direction Y as shown in FIG. 5a) of the support pad 102 is greater than or equal to the length of the side edge of the driver IC 101 corresponding to the support pad 102.

Moreover, a plurality of electronic components and circuit structures are provided on the driver IC 101. In order to avoid influence of the support pads 102 on the electronic components and the circuit structures on the driver IC 101, the support pad 102 as described above for example is formed by an insulating material. Furthermore, in the case that the flexible circuit board 10 is deformed, the support pad 102 needs to be in contact with other parts, e.g., the back plate 12 of backlight; in order to avoid wear to the surface of the back plate 12 of backlight in the process that the support pad 102 gets in contact with the back plate 12 of backlight, the support pad for example is made of an elastic insulating material.

Furthermore, in order to improve production efficiency, the support pad 102 and the substrate 20 for example are of an integral structure, so that preparation of the support pads 102 is completed in the process of preparing the substrate.

For example, the support pad 102 and the driver IC 101 are of an integral structure, so that preparation of the support pads 102 is completed in the process of preparing the driver IC 101.

Figure 8:
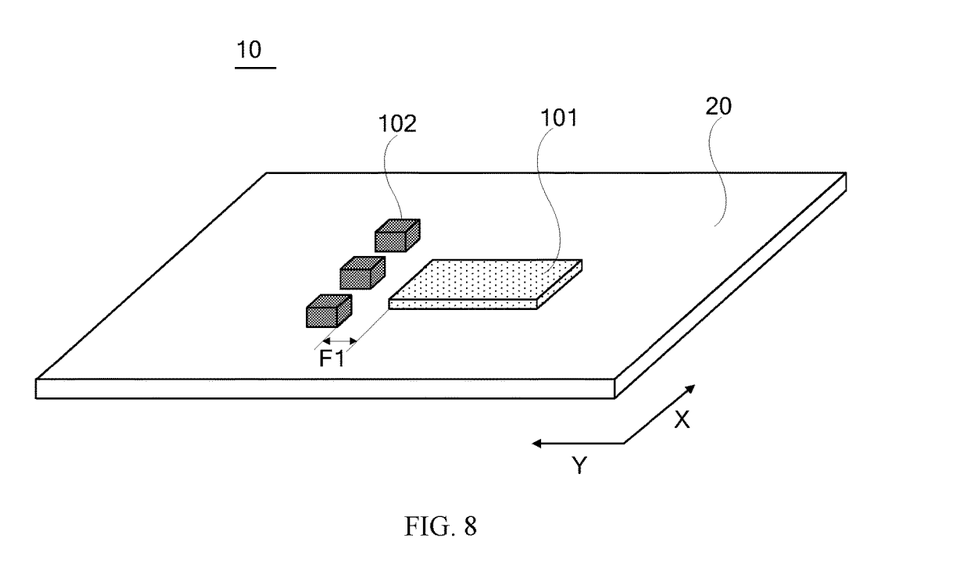
FIG. 8 is yet another schematic view illustrating the support pads of the flexible circuit board according to the embodiments of the present disclosure.

It should be noted that, as shown in FIG. 2, the support pad 102 provided in the first direction is of a continuous structure. However, the embodiments of the present disclosure are not limited hereto; and for example, as shown in FIG. 8, the support pad 102 provided in the first direction are discontinuous to include a plurality of subsections disconnected from each other. Similarly, the support pad 102 provided in the second direction is continuous, or is discontinuous to include a plurality of subsections disconnected from each other.

The embodiments of the present disclosure provide a display apparatus which includes any flexible circuit board described above. It should be noted that, in the embodiments of the present disclosure, the display apparatus for example includes a liquid crystal display apparatus and an organic light-emitting display apparatus. For example, the display apparatus is any product or part with a display function, such as a liquid crystal display, a liquid crystal television, a digital photo frame, a mobile phone or a tablet personal computer and the like.

The foregoing embodiments merely are exemplary embodiments of the disclosure, and not intended to define the scope of the disclosure, and the scope of the disclosure is determined by the appended claims.

The present application claims priority of the Chinese Patent Application No. 201610005933.9 filed on Jan. 4, 2016, the disclosure of which are incorporated herein by its reference in its entirety as part of the present application.

The invention claimed is:

1. A flexible circuit board, comprising a substrate and a driver integrated circuit provided on the substrate, wherein, the flexible circuit board further comprises a support pad, the support pad is provided on at least one side of the driver integrated circuit in a first direction, and a height of the support pad is greater than a height of the driver integrated circuit; a distance between the support pad and the driver integrated circuit in the second direction is smaller than or equal to a width of the driver integrated circuit in a second direction; and directions in which two adjacent side edges of the driver integrated circuit are provided are respectively the first direction and the second direction; wherein the support pad is further provided on at least one side of the driver integrated circuit in the second direction, and a distance between the support pad provided in the second direction and the driver integrated circuit in the first direction is smaller than or equal to a width of the driver integrated circuit in the first direction.

2. The flexible circuit board according to claim 1, wherein, the support pads which are respectively provided on two adjacent sides of the driver integrated circuit are of an integral structure.

3. The flexible circuit board according to claim 1, wherein, the support pads which are provided around the driver integrated circuit are of an integral structure.

4. The flexible circuit board according to claim 1, wherein, the support pad and the substrate are of an integral structure.

5. The flexible circuit board according to claim 1, wherein, the support pad and the driver integrated circuit are of an integral structure.

6. The flexible circuit board according to claim 1, wherein, the support pad is of a strip shape.

7. The flexible circuit board according to claim 1, wherein, a range of a difference between the height of the support pad and the height of the driver integrated circuit is 0.1 mm to 1 mm.

8. The flexible circuit board according to claim 1, wherein, a width of the support pad, which is provided in the first direction, along the second direction is 0.1 mm to 5 mm.

9. The flexible circuit board according to claim 1, wherein, a length along the first direction of the support pad, which is provided in the first direction, is greater than or equal to a length of the side edge of the driver integrated circuit corresponding to the support pad.

10. The flexible circuit board according to claim 1, wherein, a width along the first direction of the support pad, which is provided in the second direction, is 0.1 mm to 5 mm.

11. The flexible circuit board according to claim 1, wherein, a length along the second direction of the support pad, which is provided in the second direction, is greater than or equal to a length of the side edge of the driver integrated circuit corresponding to the support pad.

12. The flexible circuit board according to claim 1, wherein, the support pad is made of an elastic insulating material.

13. The flexible circuit board according to claim 1, wherein, the support pad provided in the first direction has a plurality of subsections disconnected from each other.

14. The flexible circuit board according to claim 1, wherein, the support pad provided in the second direction has a plurality of subsections disconnected from each other.

15. A display apparatus, comprising the flexible circuit board according to claim 1.

* * * * *